(12) United States Patent
Lin et al.

(10) Patent No.: US 8,551,798 B2
(45) Date of Patent: Oct. 8, 2013

(54) MICROSTRUCTURE WITH AN ENHANCED ANCHOR

(75) Inventors: Chung-Hsien Lin, Hsinchu (TW); Chia-Hua Chu, Zhubei (TW); Chun-Wen Cheng, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 419 days.

(21) Appl. No.: 12/887,320

(22) Filed: Sep. 21, 2010

(65) Prior Publication Data
US 2012/0068276 A1    Mar. 22, 2012

(51) Int. Cl.
*H01L 21/00*    (2006.01)
(52) U.S. Cl.
USPC ............... 438/48; 438/49; 438/50; 438/52; 438/53
(58) Field of Classification Search
USPC ...................................... 438/48–98
See application file for complete search history.

(56) References Cited

U.S. PATENT DOCUMENTS

| 2004/0048410 A1* | 3/2004 | O'Brien et al. ............. 438/52 |
| 2007/0202626 A1* | 8/2007 | Liu ............................ 438/48 |
| 2010/0188728 A1* | 7/2010 | Warashina et al. ......... 359/290 |
| 2010/0233882 A1* | 9/2010 | Yu ............................. 438/704 |

\* cited by examiner

*Primary Examiner* — Jae Lee
(74) *Attorney, Agent, or Firm* — Haynes and Boone, LLP

(57) ABSTRACT

The present disclosure provides a microstructure device with an enhanced anchor and a narrow air gap. One embodiment of a microstructure device provided herein includes a layered wafer. The layered wafer includes a silicon handle layer, a buried oxide layer formed on the handle layer, and a silicon device layer formed on the buried oxide layer. A top oxide layer is formed on the device layer. The top oxide layer, the device layer, and the buried oxide layer are etched, thereby forming trenches to create an anchor and a microstructure device in the device layer. In process of fabricating the device, a thermal oxide layer is formed along sides of the microstructure device to enclose the microstructure device in the buried oxide layer, the top oxide layer and the thermal oxide layer. Then, a poly layer if formed to fill in the trenches and enclose the anchor. After the poly layer fills in the trenches, the oxide layers enclosing the microstructure device are etched away, releasing the microstructure device.

20 Claims, 16 Drawing Sheets

MICROSTRUCTURE WITH AN ENHANCED ANCHOR

BACKGROUND

The present disclosure relates generally to semiconductor manufacturing. Specifically, the present disclosure relates to a semiconductor device having a microstructure device having an enhanced anchor along with a method of fabricating the same.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Microelectromechanical systems (MEMS) devices are very small electro-mechanical systems incorporated into semiconductor IC circuits. One example of a MEMS device is a micro-inertial sensor. Conventional silicon on insulator (SOI) type MEMS devices are fabricated using a buried oxide layer as a sacrificial material layer. As such, the oxide layer is removed at a later stage of fabrication where the amount of oxide to be removed is time controlled. Drawbacks of this approach include 1) uniformity of the undercut etching is hard to control during fabrication, which 2) creates a wide undercut under the anchor area, and 3) does not produce a narrow air gap structure (e.g., <200 nm).

Therefore, what is needed is an improved microstructure device with an enhanced anchor, and a method of fabrication.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
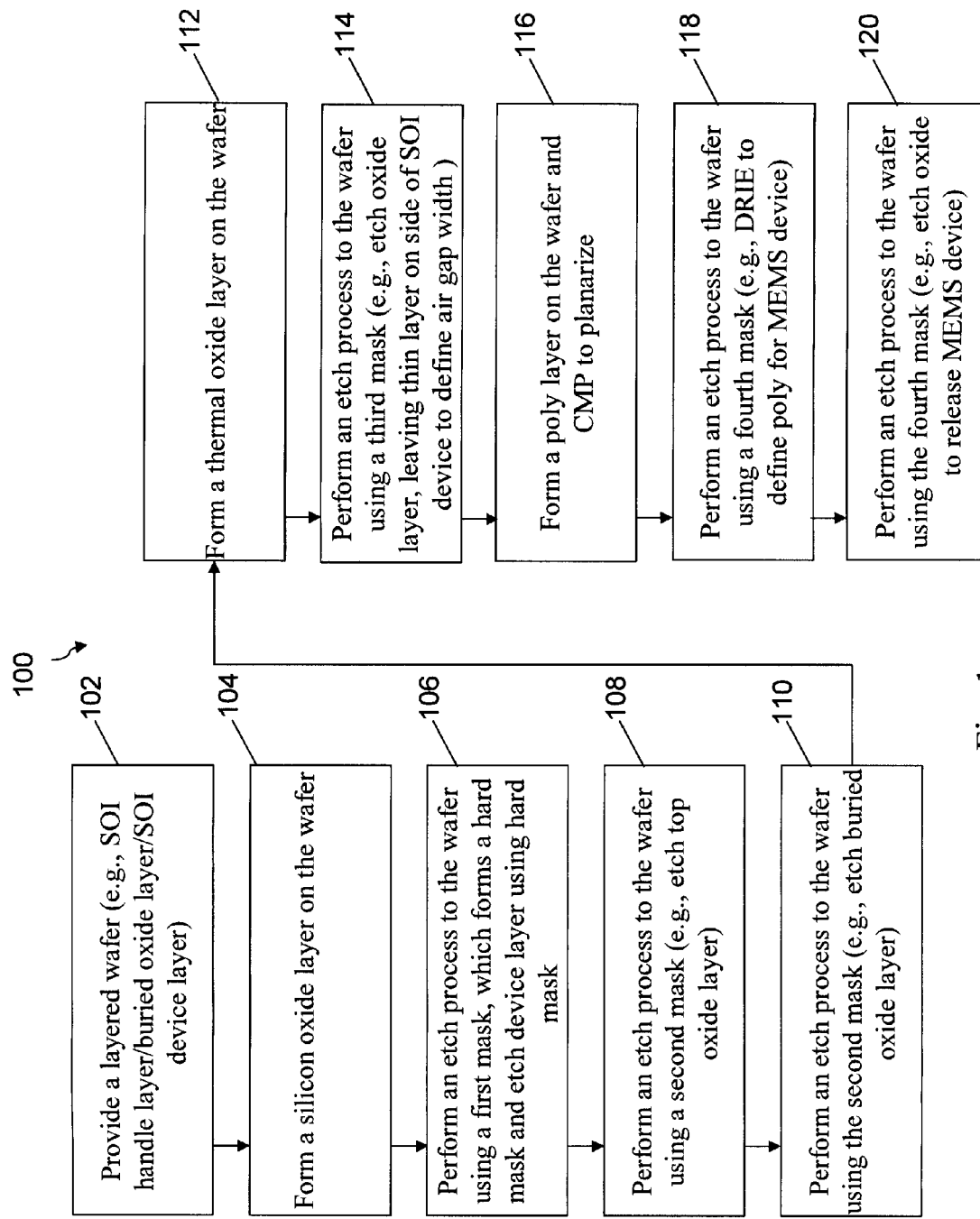
FIG. 1 is a flow chart illustrating an embodiment of a method of fabricating a microstructure device with an enhanced anchor.
Figure 2:
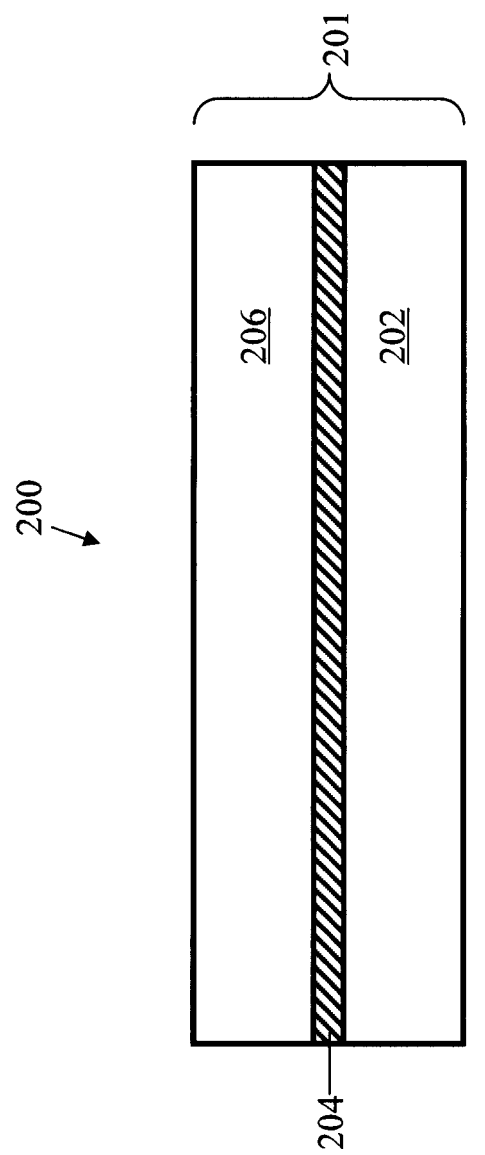
FIGS. 2-11 are cross-sectional views illustrating an embodiment of a microstructure device according to the method of FIG. 1 at various stages of fabrication.
Figure 3:
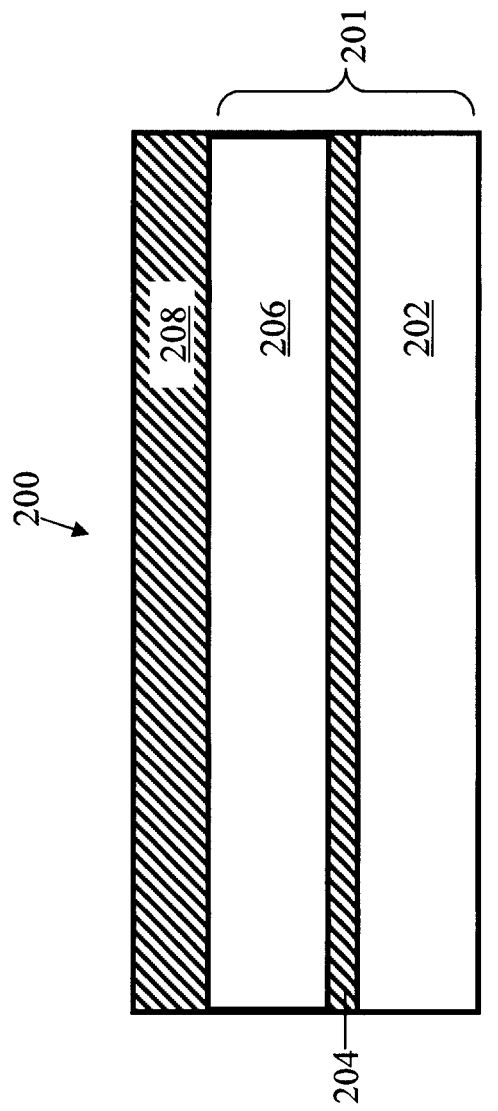
Figure 4:
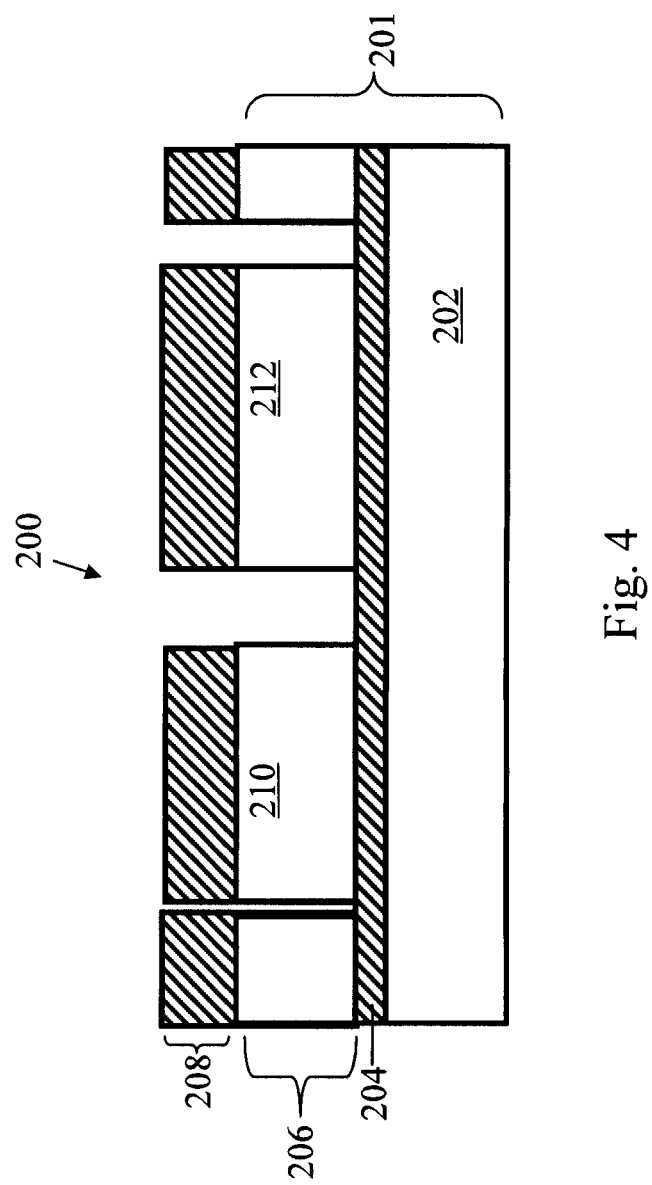
Figure 5:
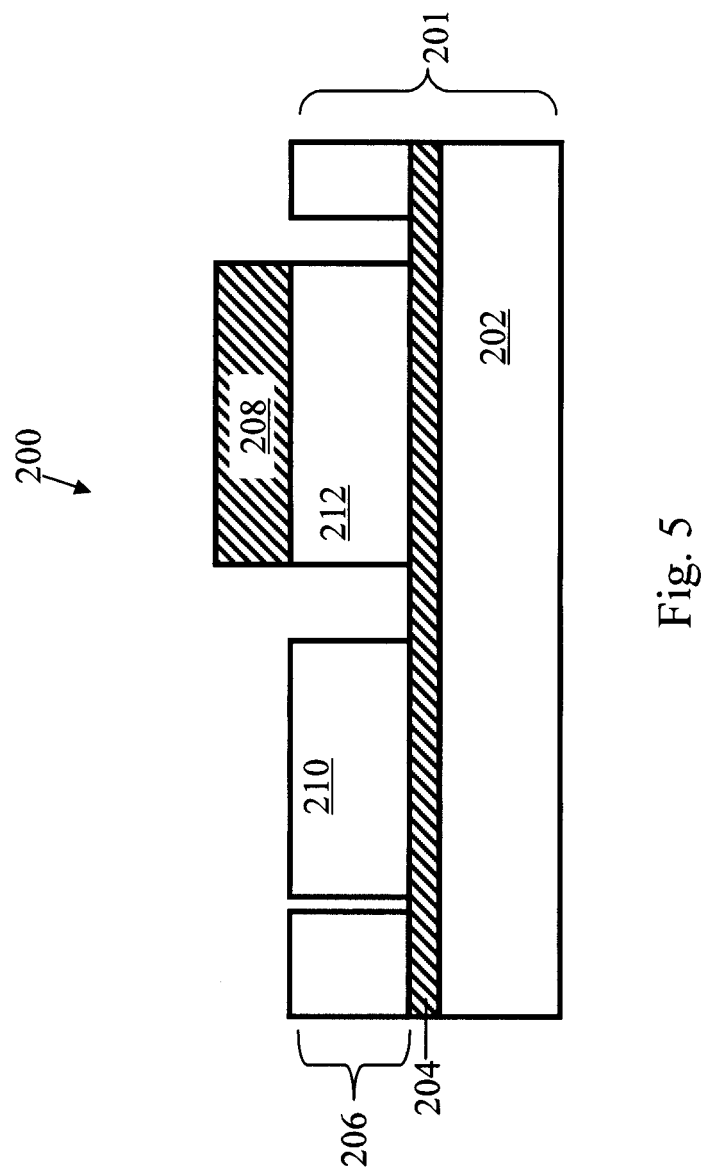
Figure 6:
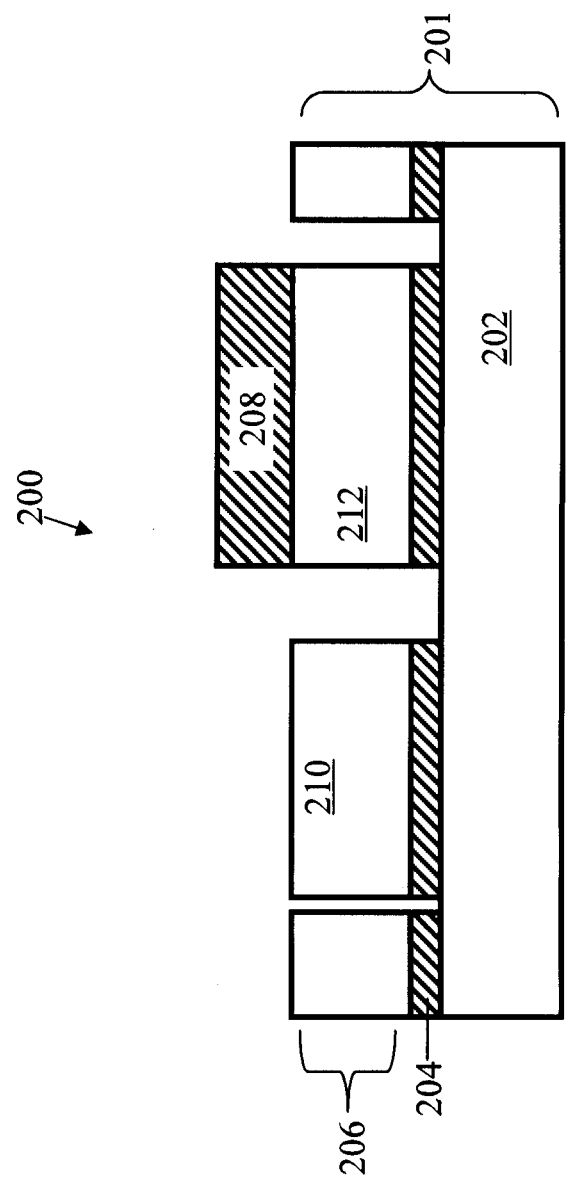
Figure 7:
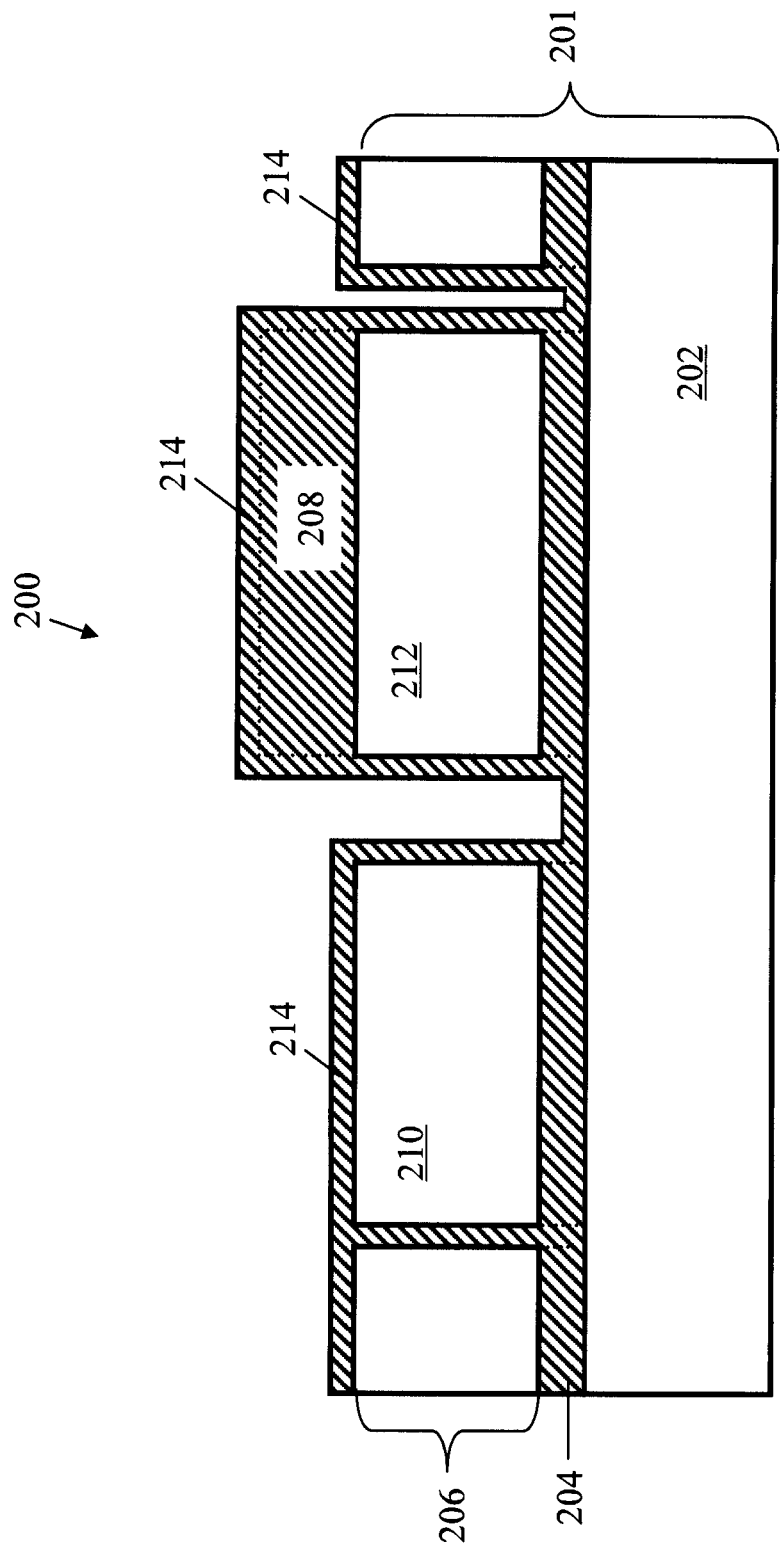
Figure 8:
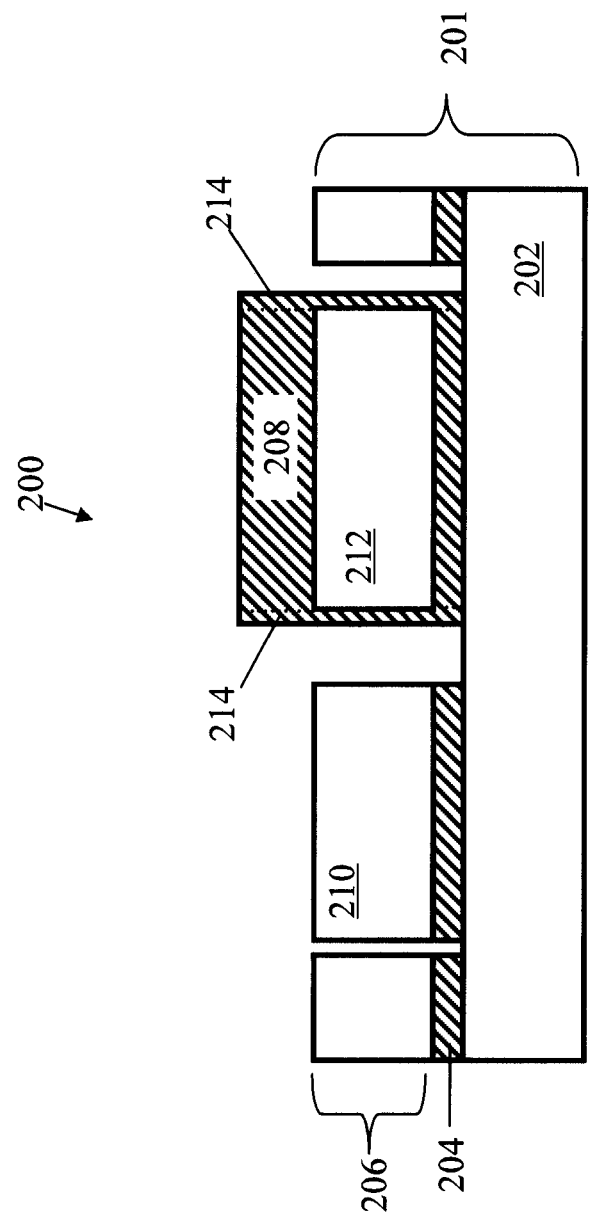
Figure 9:
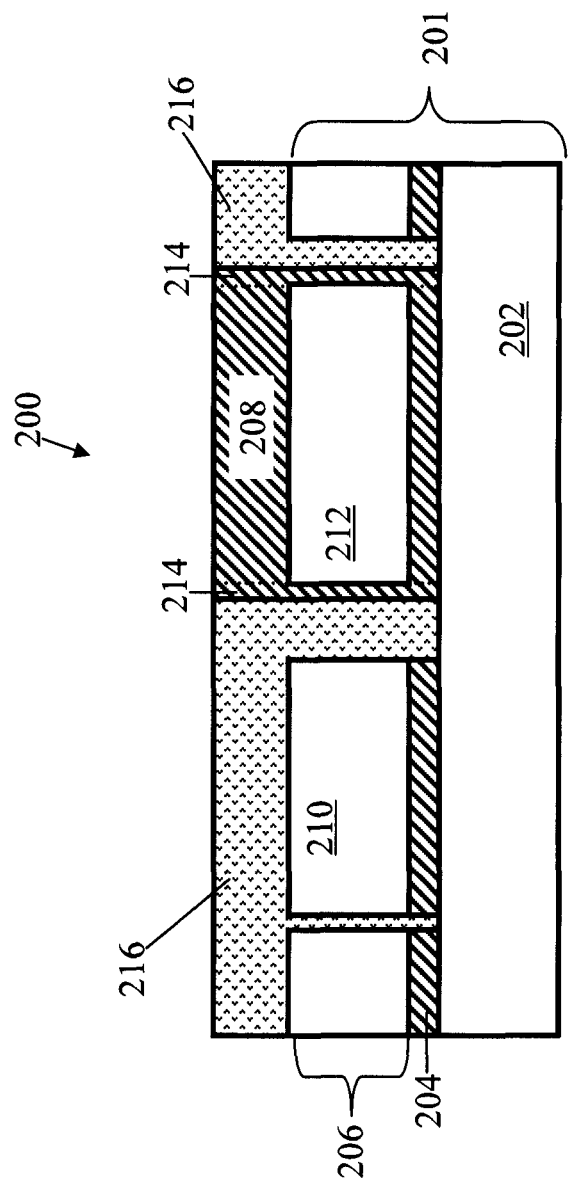
Figure 10:
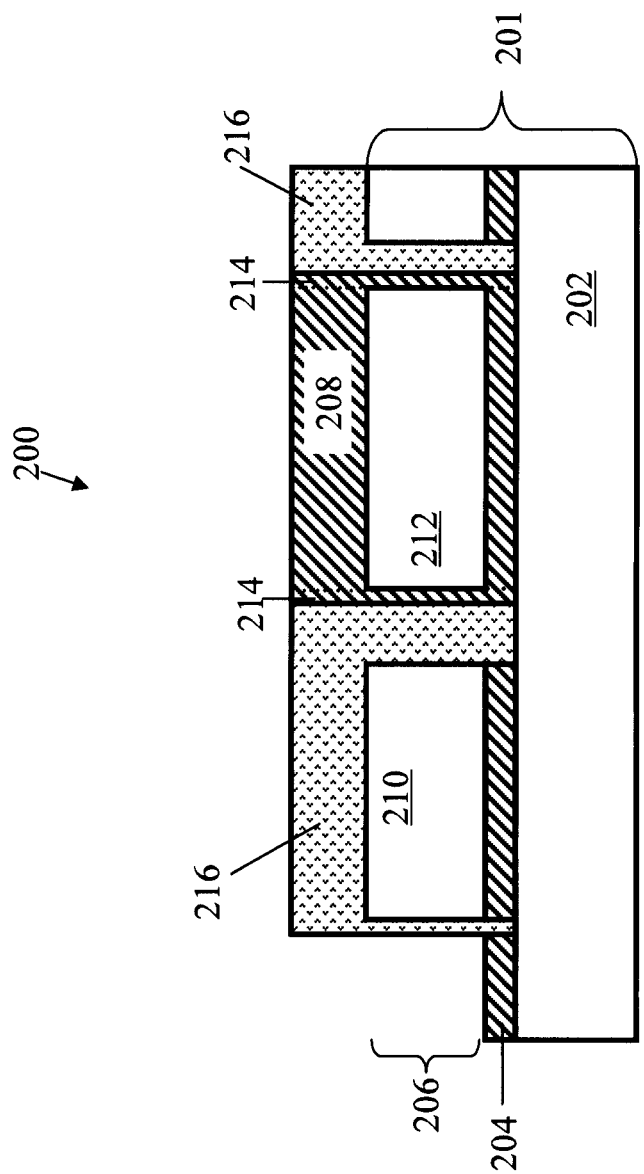
Figure 11:
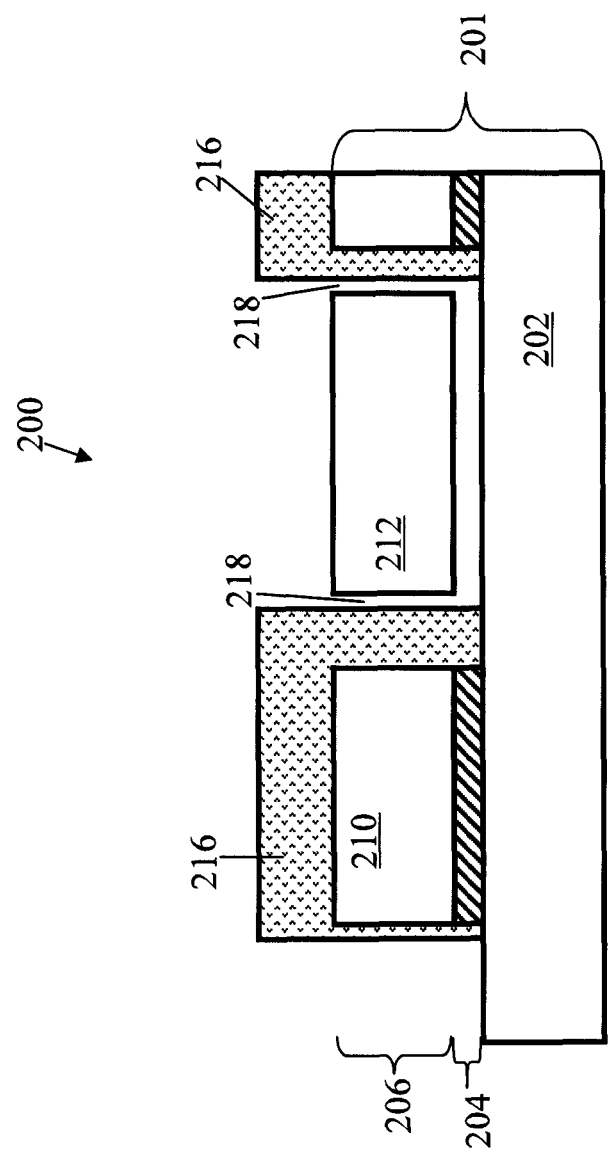

The present disclosure relates generally to semiconductor manufacturing. Specifically, the present disclosure relates to a composite wafer structure semiconductor device and method of fabricating. In an embodiment, the present disclosure provides a semiconductor micro-machined device, such as a micro-inertial sensor. In one embodiment, the present disclosure provides a complementary metal oxide semiconductor (CMOS) chip having a narrow air gap microstructure with an enhanced anchor. Using the methods described herein the device's operating characteristics and physical structure are enhanced with respect to traditional devices.

It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer includes embodiments where the first and second layer are in direct contact and those where one or more layers are interposing the first and second layer. The present disclosure refers to MEMS devices; however, one of ordinary skill in the art will find other applicable technologies that may benefit from the disclosure such as, nanoelectromechanical systems (NEMS) devices, application specific integrated circuit (ASIC) devices, and other such devices. Furthermore, the MEMS device structure or design illustrated is exemplary only and not intended to be limiting in any manner.

FIG. 1 is a flow chart illustrating an embodiment of a method 100 of fabricating a narrow air gap microstructure device with an enhanced anchor. Cross-sectional views of different embodiments of such narrow air gap microstructure devices are shown in FIGS. 2-16 at stages of fabrication. The present disclosure is described herein with respect to embodiments shown in FIGS. 2-16 relating to the method 100 provided in FIG. 1. The method 100 provides for a narrow air gap microstructure semiconductor fabrication process. One of ordinary skill in the art would recognize additional steps that may be included in the method 100 and/or omitted from the method 100. The method 100 and the corresponding FIGS. 2-16 are exemplary only and not intended to be limiting. For example, the structure of the MEMS devices depicted in the figures are exemplary only and similar methods may be used to form other devices. CMOS circuitry may be included in the devices depicted in FIGS. 2-16.

Accordingly, as should be understood by those having ordinary skill in the art, the present disclosure provides embodiments of a microstructure device (e.g., a microelectromechanical systems (MEMS) device) that includes a filled-in material anchored to a base substrate, which provides an etch stop layer that prevents undercut or failure of device anchors and produces better transduction of signals across a narrow gap to other structures. As should also be understood, a microstructure device having no undercut creates a larger, stronger anchor for the microstructure device and also provides for better controlled uniformity of fabrication of such device. In an embodiment, the present disclosure provides a system for fabricating microstructure devices having an air gap less than 200 nm, which yields a higher electrical capacitance and better transduction for the device.

FIGS. 2-11 are cross-sectional views illustrating an embodiment of a microstructure device 200 according to the method 100 of FIG. 1 at various stages of fabrication. The method 100 begins at block 102 where a layered wafer 201

(FIG. 2) is provided. The layered wafer 201 includes a handle layer 202, a buried oxide layer 204 and a device layer 206.

In an embodiment, the handle layer 202 is an undoped silicon (Si), high resistance, substrate of any thickness. In an embodiment, the handle layer 202 has an approximate resistivity >3000 Ohm-cm. In an embodiment, the handle layer 202 may include a bonded silicon on insulator (SOI) substrate. The handle layer 202 may be crystalline Si or poly Si. In alternative embodiments, the handle layer 202 may include other elementary semiconductors such as germanium, or may include a compound semiconductor such as, silicon carbide, gallium arsenide, indium arsenide, and indium phosphide. One or more isolation features may be formed on the handle layer 202. The handle layer 202 may also include one or more integrated circuit devices (not shown), such as CMOS devices, (e.g., NMOS and/or PMOS transistors). The handle layer 202 may include circuitry associated with the transistors such as interconnect layers (e.g., metal lines and vias) and interlayer dielectric layers (ILD).

In an embodiment, the buried oxide layer 204 is a silicon oxide (SiO2) layer having a thickness range of approximately 1 um-3 um. The buried oxide layer 204 may include a nitride layer to improve isolation.

In an embodiment, the device layer 206 is a doped silicon (Si), low resistance, substrate having a thickness range of approximately 5 um-40 um. In an embodiment, the device layer 206 has an approximate resistivity <1 Ohm-cm. In an embodiment, the device layer 206 may include a bonded silicon on insulator (SOI) substrate. The device layer 206 may be crystalline Si or poly Si. In alternative embodiments, the device layer 206 may include other elementary semiconductors such as germanium, or may include a compound semiconductor such as, silicon carbide, gallium arsenide, indium arsenide, and indium phosphide. One or more isolation features may be formed on the device layer 206. The device layer 206 may also include one or more integrated circuit devices (not shown), such as CMOS devices, (e.g., NMOS and/or PMOS transistors). The device layer 206 may include circuitry associated with the transistors such as interconnect layers (e.g., metal lines and vias) and interlayer dielectric layers (ILD).

The method 100 proceeds to block 104 (FIG. 3) where a top silicon oxide (e.g., SiO2) layer 208 is formed on the device layer 206 to have a thickness range of approximately 0.5 um-3 um, however other thicknesses of oxide may be formed. In an embodiment, the top oxide layer 208 is grown on the device layer 206 using a thermal oxidation heat process. In another embodiment, the top oxide layer 208 is deposited on the device layer 206 using a chemical vapor deposition (CVD), plasma enhanced CVD, spin-on, sputter, or other depositing process for forming dielectric layers on a substrate.

The method 100 then proceeds to block 106 (FIG. 4) where an etch process, including a first photolithography mask, is performed on the top oxide layer 208, forming the top oxide layer 208 into a patterned hard mask. Using the hard mask of the top oxide layer 208, an etch process is performed on the device layer 206 to form an anchor section 210 and a microstructure section 212 in the device layer 206. In an embodiment, the etch process performed on the device layer includes a deep reactive ion etch (DRIE) process to etch the silicon of the device layer 206. The etching processes may include a wet etching process, a dry plasma etching process, and/or other etching processes suitable for forming trenches to define the anchor 210 and microstructure device 212 portions of the device layer 206. It should be understood that a DRIE process may include an anisotropic etching process capable of forming deep holes and trenches having aspect ratios of 20:1 or more. The DRIE process may include cryogenic or Bosch etching processes.

Continuing on, the method 100 steps to block 108 (FIG. 5) where an etch process, including a second photolithography mask, is performed on the top oxide layer 208, removing a portion of the top oxide layer 208, except for a portion above the microstructure device 212. Accordingly, an embodiment provides that the microstructure device 212 includes a silicon oxide layer both below (204) and above (208) the device 212. The etching processes may include a wet etching process, a dry plasma etching process, and/or other etching processes suitable for etching silicon oxide layers.

The method 100 then proceeds to block 110 (FIG. 6) where another etch process is performed on the buried oxide layer 204 in the trenches. In an embodiment, this etching process is performed using the second photolithography mask discussed above with respect to block 108. The etching processes may include a wet etching process, a dry plasma etching process, and/or other etching processes suitable for etching silicon oxide layers. After the etching process, the trenches extend down to the handle layer 202. It should be understood that the etching processes of blocks 108 and 110 may be performed as a single process.

Next, the method 100 proceeds to block 112 (FIG. 7) where a thermal oxide (e.g., SiO2) layer 214 is formed on the wafer 201. In an embodiment, the thermal oxide layer 214 has a thickness less than approximately 3000 angstrom. In an embodiment, the thermal oxide layer 214 has a thickness of approximately 500 angstrom. However, other thicknesses of oxide may be formed. In an embodiment, the thermal oxide layer 214 is grown using a thermal oxidation heat process. In an embodiment, an optional nitride layer may be deposited using a low pressure CVD (LPCVD) process. Also in an alternative embodiment, an optional high k material layer, such as HfO2 and ZrO2, may be formed.

The method 100 follows next to block 114 (FIG. 8) where an etch process, including a third photolithography mask, is performed on the thermal oxide layer 214, removing a portion of the thermal oxide layer 214, except for a portion of the oxide layer 214 along sides of the microstructure device 212. Accordingly, an embodiment provides that the microstructure device 212 includes an oxide layer both below (204) and above (208) the microstructure device 212 and also along the sides (214) of the microstructure device 212, encapsulating the microstructure device 212 in oxide. As will be shown below, the thickness of the oxide layer along the sides (214) of the microstructure device 212 define an air gap for the microstructure device 212. In other words, a thinner layer of oxide 214 provides a thinner air gap for the microstructure device 212. Additionally, the etching process removes the thermal oxide layer 214 from the lower surface of the trenches, exposing the handle layer 202. As such, the anchor 210 and the microstructure device 212 are substantially isolated from one another. However, it should be understood that in the fabrication of this device 200 (e.g., as a MEMS devices) the microstructure device 212 may be supported by the anchor 210 in the device 200, such as in front of the section view shown and/or behind the section view shown in the figures. In an embodiment, the etching process includes a wet etching process using an Hf based etchant. However, other etching processes and etchants may be used to etch the thermal oxide layer 214.

The method 100 then proceeds to block 116 (FIG. 9) where a poly layer 216 is deposited on the wafer 201 to fill the trenches and also to form a top cap for the anchor 210. Then, a planarization process (e.g., a chemical-mechanical polish (CMP)) process is performed on the device 200 to planarize the upper surface of the device 200. In an embodiment, the poly layer 216 is also deposited over the microstructure device 212, but that is later removed down to the top oxide layer 208 during the planarization process. In an embodiment, the poly layer 216 has a thickness range of approximately 1 um-3 um. The poly layer 216 may comprise Si3N4+ poly silicon, a high k material (e.g., HfO2, ZrO2)+poly silicon, and/or combinations thereof formed using a LPCVD process. In another embodiment, the poly layer 216 may comprise a poly silicon grown in a two-step process as a high resistance poly and then a low resistance poly, which increases isolation to the handle 210.

The method 100 proceeds to block 118 (FIG. 10) where an etch process, including a fourth photolithography mask, is performed on the poly layer 216, removing a portion of the poly layer 216 and a portion of the device layer 206, such as the device layer 206 adjacent the anchor 210. In other words, this etch process delineates deep geometrical features in the device silicon layer 206 used to shape the microstructure (e.g., MEMS) device. Said another way, this etch process defines structure of the poly layer 216. In an embodiment, the etch process is a DRIE etch process.

Next, the method 100 proceeds to block 120 where another etch process is performed to remove the oxide layers (e.g., 204, 208 and 214) that were enclosing the microstructure device 212. This etch process may used the fourth mask described above for block 18. As mentioned above, the microstructure device 212 is supported by the anchor 210 and related structure three-dimensionally into or out of the device 200 (e.g., in front of and/or in back of the sectional views shown in the figures). For example support springs (not shown) may couple the microstructure 212 to the anchor 201 and allow the microstructure 212 to flex so without breaking. In an embodiment, the etching includes a vapor HF etching process or an HF wet etching process. As should be understood, because the etchant, in this situation, does not etch the poly layer 216, the buried oxide layer 204 attaching the anchor 210 to the handle layer 202 is not etched away and consequently, is not undercut by the etching process. In other words, the poly layer 216 acts as an etch stop layer protecting the buried oxide layer 204 and the anchor 210. As described above, with respect to block 114, the oxide layer 214 defined the air gap 218 for the microstructure device 212, now that the oxide layer 214 is removed.

The usefulness of the device 200 described above with respect to method 100 should be readily understood by those having ordinary skill in the art. The devices shown in FIGS. 12-16 described below may be fabricated, in part, using the method 100 and may have features substantially similar to that of device 200. Accordingly, features and processes, which are similar to those described for device 200 are not duplicated here for simplicity.

Figure 12:
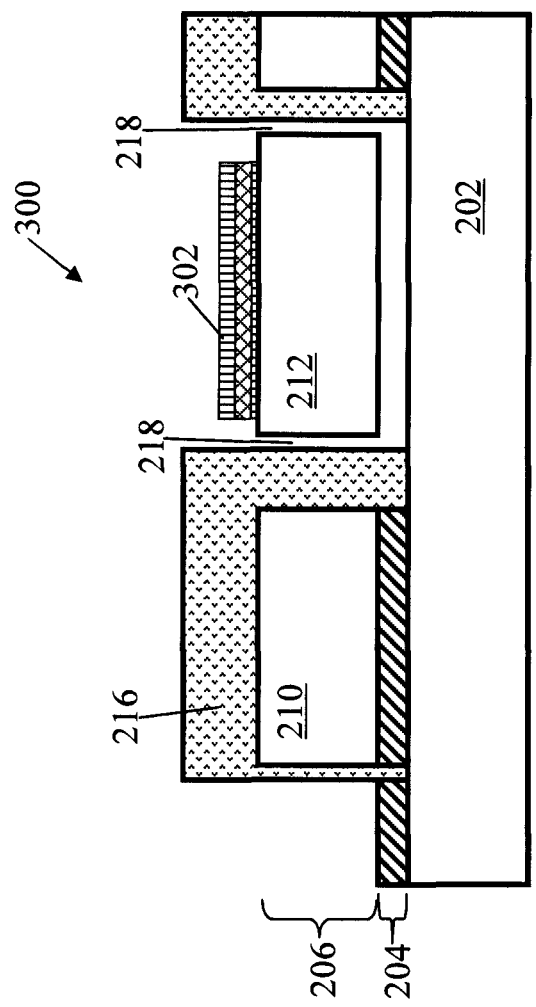
FIG. 12 is a cross-sectional view illustrating an embodiment of another microstructure device according to the method of FIG. 1 at a stage of fabrication.

FIG. 12 is a cross-sectional view illustrating an embodiment of a microstructure device 300 at a stage of fabrication. In an embodiment, the device 300 is formed using the method 100 and is similar to the device 200. In addition, the device 300 includes a piezoelectric transducer 302 (or other MEMS type device) fabricated on the microstructure device 212. In an embodiment, the transducer 302 includes a bottom metal layer, a piezoelectric layer and a top metal layer. The bottom and top metal layers may include Al, Pt, Mo, AlCu, Ti, and combinations thereof. The piezoelectric layer may include MN, PZT, and/or ZnO. However, other materials may be used for the metal layers and the piezoelectric layers. The transducer 302 may be fabricated on or otherwise bonded to the microstructure device 212 before the oxide release below the microstructure device 212 described in block 120. The layers of the piezoelectric transducer may be formed using a sputter deposition or other process.

Figure 13:
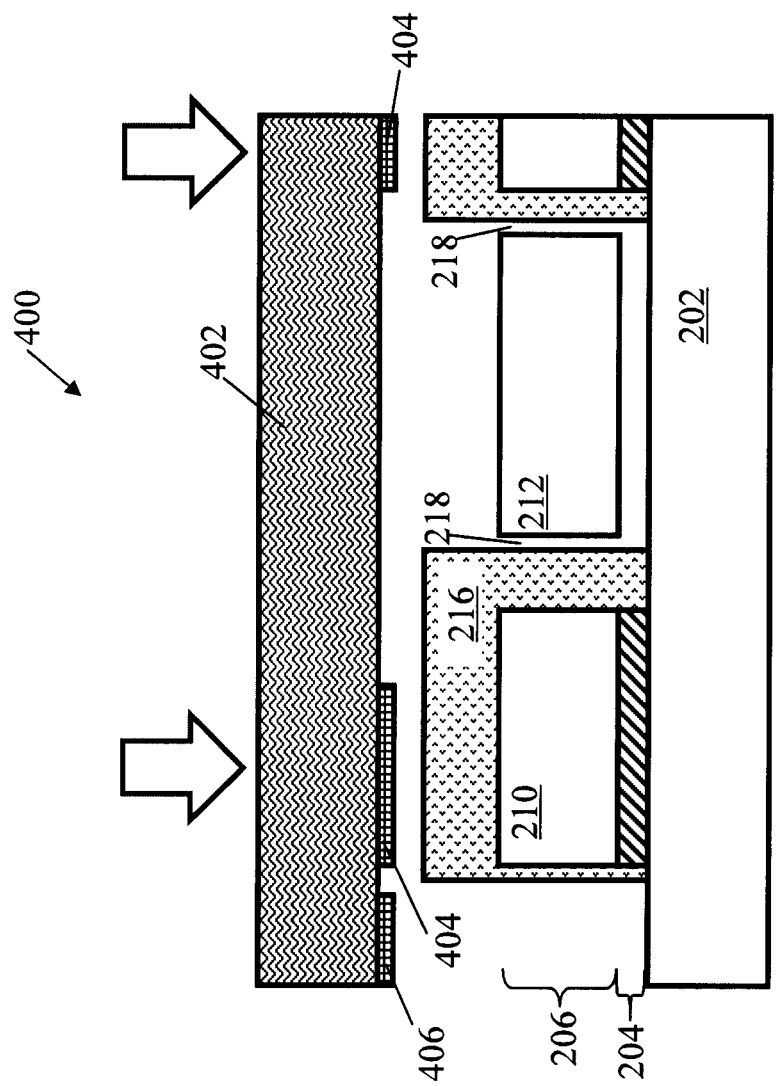
FIGS. 13-14 are cross-sectional views illustrating an embodiment of still another microstructure device according to the method of FIG. 1 at various stages of fabrication.
Figure 14:
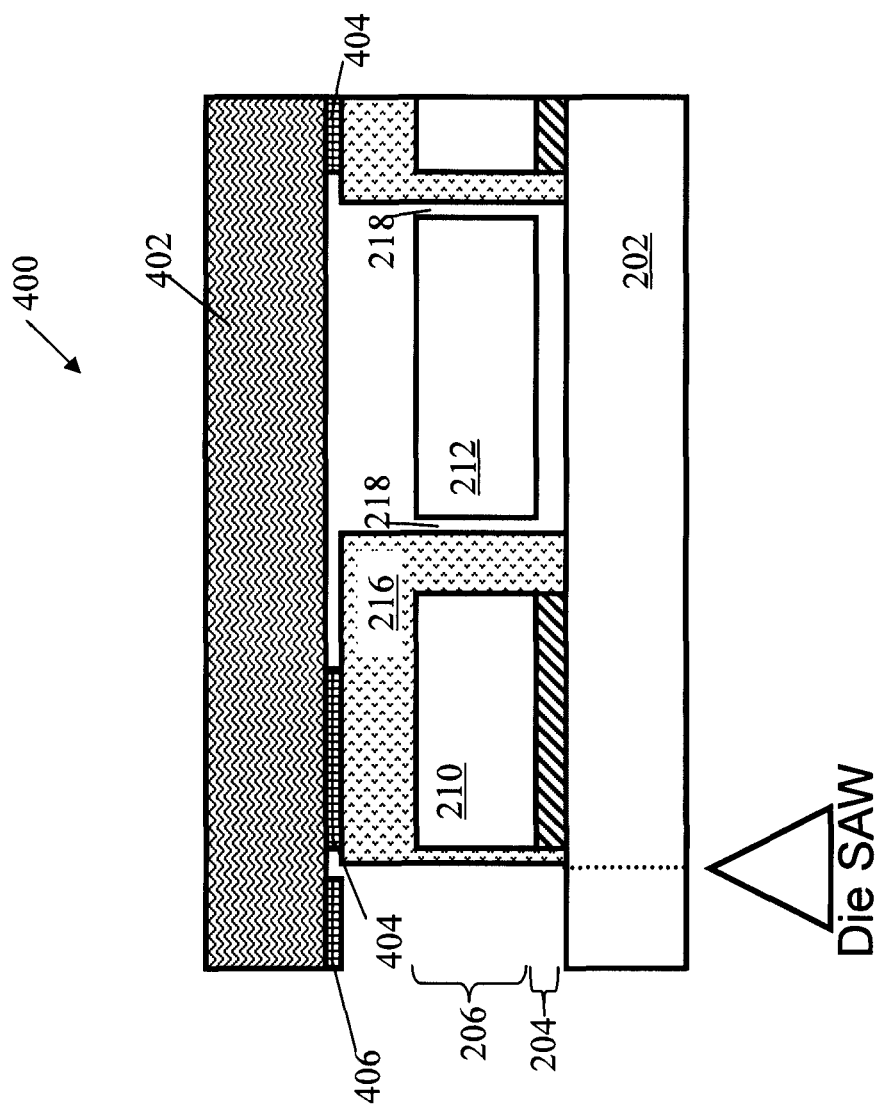

FIGS. 13-14 are cross-sectional views illustrating an embodiment of a microstructure device 400 at various stages of fabrication. In an embodiment, the device 400 is formed using the method 100 and is similar to the device 200. In addition, the device 400 includes a CMOS wafer 402 bonded to the device 400, thereby creating a hermetically sealed package and CMOS integrated circuit device. The CMOS wafer 402 includes a number of metal (e.g., Al, Cu, etc.) pads 404 formed as a top layer for the wafer 402 using traditional CMOS processes. The metal pads 404 are bonded to the poly layer 216 using a eutectic bond process, as shown in FIG. 14. The bonding process parameters are depending on metal pattern density and material properties. A typical bonding temperature may be performed at a temperature range of approximately 300 C to approximately 450 C. A typical bonding force is a range of approximately 10 kN to approximately 90 kN. A typical bonding time may be less than 15 minutes. However, it should be understood that other values may be used with the present disclosure. In an embodiment, the pads 404 electrically couple with circuitry, such as a driver circuit, on the CMOS wafer 402, thereby providing electrical coupling with other portions of the microstructure device 400 via the poly layer 216. In addition, the CMOS wafer 402 may include a contact pad 406, which couples circuitry in the device 400 outside of the device 400. As shown in FIG. 14, a die saw or other device may be used to remove a portion of the handle layer 202 to allow easier access to the contact pad 406.

Figure 15:
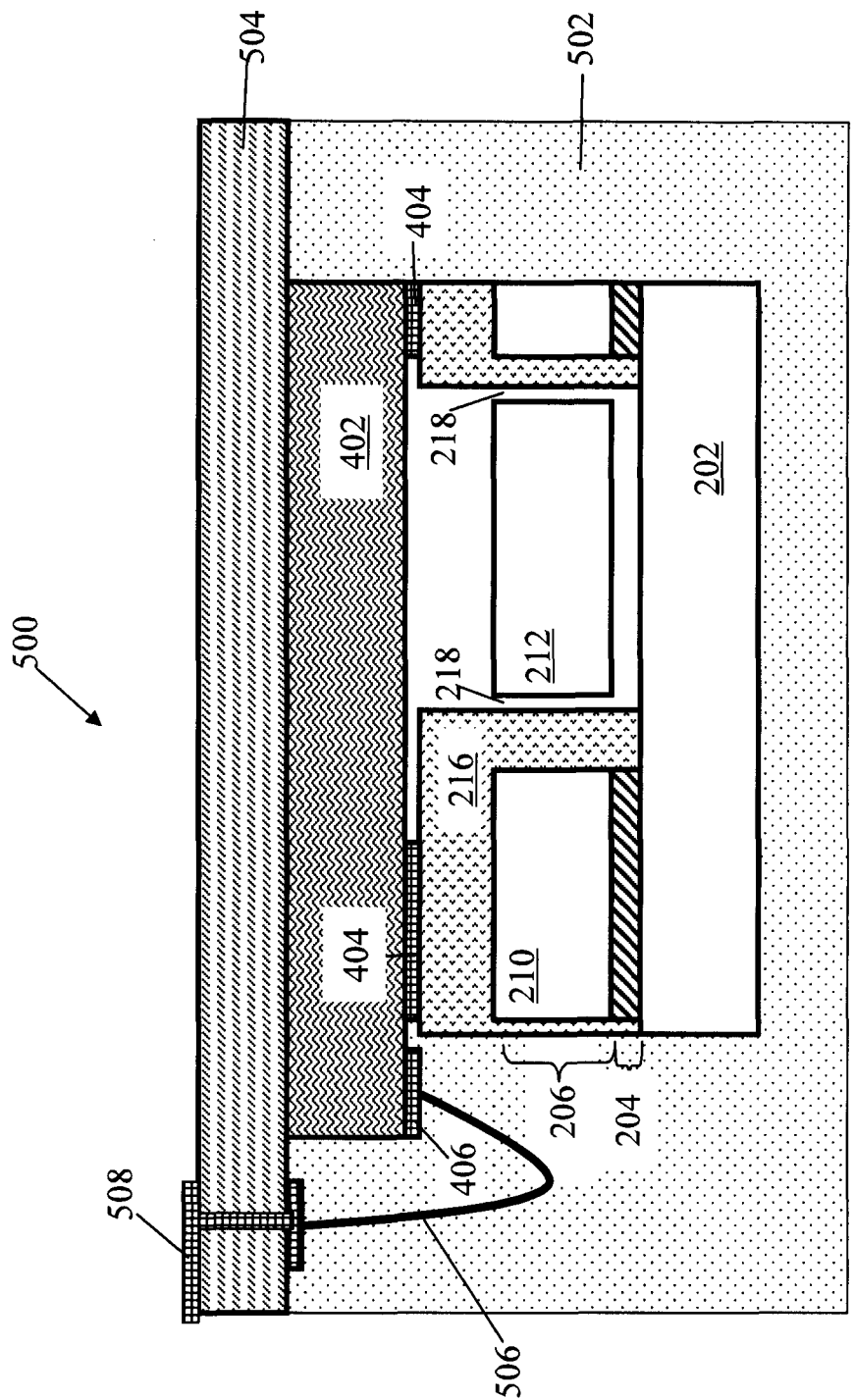
FIG. 15 is a cross-sectional view illustrating an embodiment of yet another microstructure device according to the method of FIG. 1 at a stage of fabrication.

FIG. 15 is a cross-sectional view illustrating an embodiment of a microstructure device 500 at a stage of fabrication. In an embodiment, the device 500 is formed using the method 100 and is similar to the device 400. In addition, the device 500 is enclosed in a package 502 and top cap 504 assembly. In an embodiment, the package 502 is formed using a molding process and may include an epoxy coating. In an embodiment, the top cap 504 is configured to be a printed circuit (PC) board package. The package assembly includes a wire bond 506 coupling the contact pad 406 to an outside contact 508 on the top cap 504. As should be understood packaging the device 500 provides for increased protection of the device 500.

Figure 16:
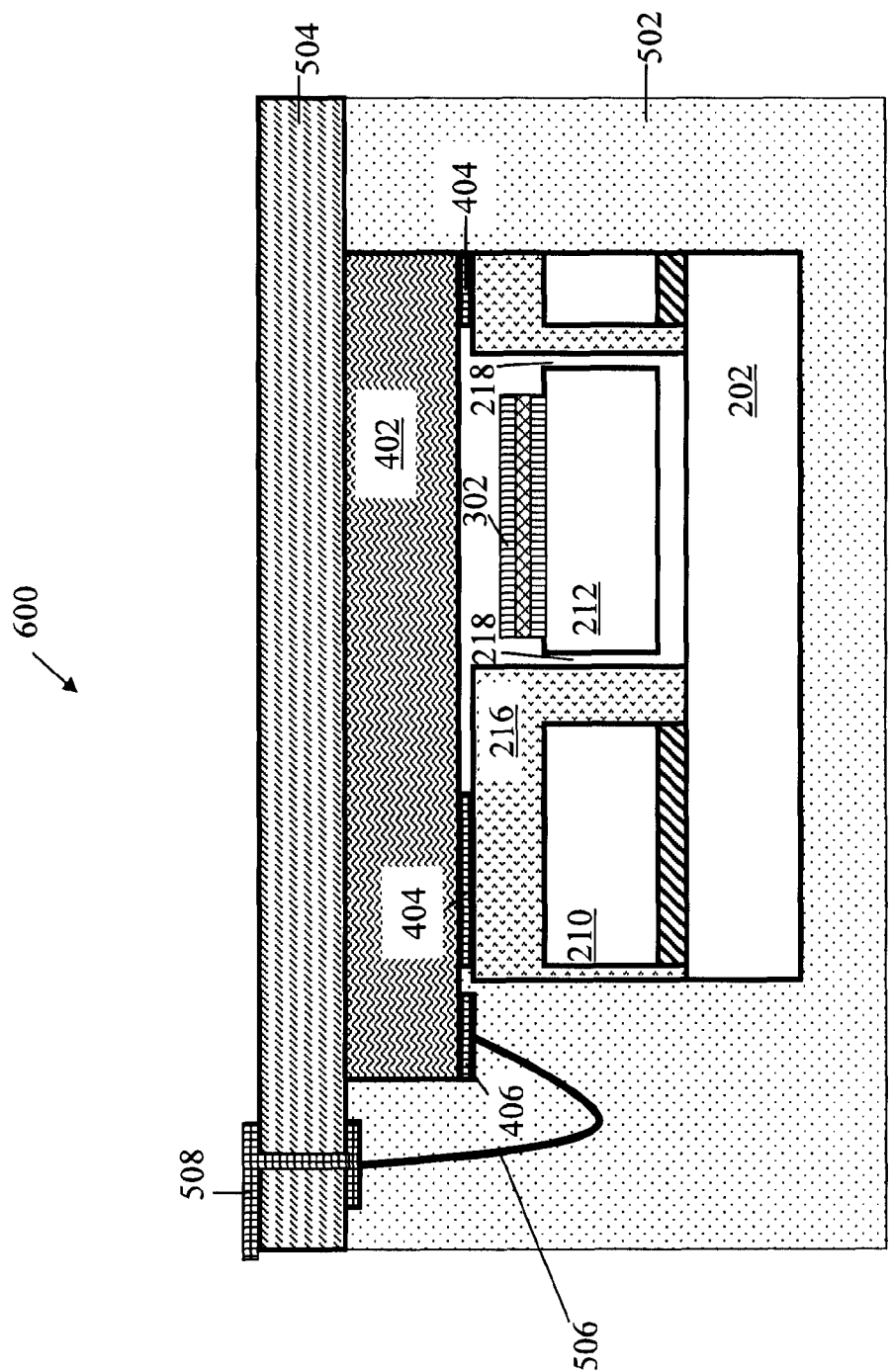
FIG. 16 is a cross-sectional view illustrating an embodiment of still yet another microstructure device according to the method of FIG. 1 at a stage of fabrication.

FIG. 16 is a cross-sectional view illustrating an embodiment of a microstructure device 600 at a stage of fabrication. In an embodiment, the device 600 is formed using the method 100 and is similar to the device 500. In addition, the device 600 includes a piezoelectric transducer 302 (or other MEMS type device) fabricated on the microstructure device 212.

As should be understood the microstructure 212 may be formed as a MEMS device, in whole or in part. The MEMS device may include a plurality of elements formed on metal, polysilicon, dielectric, and/or other materials. The MEMS device may include materials typically used in a conventional CMOS fabrication process. Any configuration of MEMS device may be possible, depending on the desired functionality. One or more of the elements depicted may be designed to provide MEMS mechanical structures of the MEMS device. The MEMS mechanical structures may include structures or elements operable for mechanical movement. The MEMS device may be formed using typical processes used in CMOS fabrication, for example, photolithography, etching processes (e.g., wet etch, dry etch, plasma etch), deposition processes, plating processes, and/or other suitable processes. In an embodiment, the MEMS device may be a motion sensor (e.g., a gyroscope, an accelerometer, etc.), a radio frequency (RF) MEMS device (e.g., an RF switch , filter, etc.), an oscillator, or any other MEMS type device. Various sizes of MEMS devices are contemplated.

The MEMS device may be configured to interact with outside perturbation, such as temperature variation, inertial movement, pressure changes, and/or other electrical, magnetic, or optical parameter measurements. For example, in an embodiment, when the devices of the present disclosure are exposed to a pressure change, the MEMS device microstructure 212 will deform inward or outward and thus, a sensing signal will be created to indicate a pressure change. It is noted that the portions of the CMOS wafer 402 may include one or more circuit devices (not shown), such as transistors (e.g., NMOS and/or PMOS transistors). The CMOS wafer 402 may also include circuitry associated with the transistors, such as interconnect layers (e.g., metal lines and vias) and interlayer dielectric layers (ILD). As should be understood, the conductor 508 may be mounted directly onto a printed circuit board (PCB) using surface-mount or other technology processes.

The present disclosure provides for many different embodiments. In one embodiment, the present disclosure describes a microstructure device with an enhanced anchor and a narrow air gap. The microstructure device includes a layered wafer. The layered wafer includes a silicon handle layer, a buried oxide layer formed on the handle layer, and a silicon device layer formed on the buried oxide layer. A top oxide layer is formed on the device layer. The top oxide layer, the device layer, and the buried oxide layer are etched, thereby forming trenches to create an anchor and a microstructure device in the device layer. In process of fabricating the device, a thermal oxide layer is formed along sides of the microstructure device to enclose the microstructure device in the buried oxide layer, the top oxide layer and the thermal oxide layer. Then, a poly layer if formed to fill in the trenches and enclose the anchor. After the poly layer fills in the trenches, the oxide layers enclosing the microstructure device are etched away, releasing the microstructure device.

In another embodiment, the present disclosure provides a method of fabricating a microstructure device. The method includes providing a layered wafer, wherein the wafer includes a handle layer, a buried oxide layer on the handle layer, and a device layer on the buried oxide layer. The method also includes depositing a top silicon oxide layer on the device layer. After the top silicon oxide layer is deposited, the method includes etching the top silicon oxide layer using a first mask, thereby forming a hard mask from the top silicon oxide layer, etching the device layer using the hard mask, thereby forming an anchor and a microstructure in the device layer, etching the top silicon oxide layer using a second mask, leaving the top silicon oxide layer on the microstructure, and etching the buried oxide layer using the second mask. Then, the method includes forming a thermal oxide layer on the wafer. Next, the method includes etching the thermal oxide layer using a third mask, leaving an oxide layer enclosing the microstructure. The method goes on to form a poly layer on the wafer and planarize the poly layer. Next, the method includes etching a portion of the poly layer and a portion of the device layer using a fourth mask, thereby creating a handle. Finally, the method includes etching away the oxide layer enclosing the microstructure, thereby releasing the microstructure.

In yet another embodiment, the present disclosure provides a microstructure device including a silicon handle layer, a buried silicon oxide layer formed on the handle layer, an anchor formed on the buried oxide layer, wherein the buried oxide layer extends along a full length of the anchor, and a poly silicon layer is formed over the anchor. The device further includes a microstructure suspended over the handle, there being an air gap between the poly silicon layer formed over the anchor and the microstructure.

As should be understood, that the present disclosure provides a microstructure semiconductor device with an enhanced anchor and a narrow air gap. The narrow air gap provides a higher capacitance and better transduction for the device. In an embodiment, an etch stop layer prevents forming an undercut under the anchor, thereby enhancing the device's anchor.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a microstructure device, the method comprising:
    providing a layered wafer, wherein the wafer includes a silicon handle layer, a buried oxide layer on the handle layer, and a silicon device layer on the buried oxide layer;
    forming a top oxide layer on the device layer;
    etching the top oxide layer, the device layer, and the buried oxide layer, thereby forming trenches to create an anchor and a microstructure device in the device layer;
    forming a thermal oxide layer along sides of the microstructure device to enclose the microstructure device in the buried oxide layer, the top oxide layer and the thermal oxide layer;
    forming a poly layer to fill in the trenches and enclose the anchor; and
    etching away portions of the buried oxide layer, the top oxide layer and the thermal oxide layer enclosing the microstructure device while the poly layer encloses the anchor.

2. The method of claim 1, wherein the etching the device layer includes a deep reactive ion etch (DRIE) process.

3. The method of claim 1, further comprising forming the microstructure device as a microelectromechanical systems (MEMS) device.

4. The method of claim 3, further comprising forming the MEMS device as a piezoelectric resonator.

5. The method of claim 1, further comprising forming the anchor to be fully attached to the buried oxide layer on a side of the anchor.

6. The method of claim 1, further comprising bonding a metal-oxide semiconductor (MOS) wafer to the poly layer after etching away the oxide layers enclosing the microstructure device.

7. The method of claim 1, further comprising encapsulating the microstructure device in a hermetically sealed package and electrically coupling the microstructure device to a contact on an outside of the package.

8. A method of fabricating a microstructure device, the method comprising:
    providing a layered wafer, wherein the wafer includes a handle layer, a buried oxide layer on the handle layer, and a device layer on the buried oxide layer;
    depositing a top silicon oxide layer on the device layer;

etching the top silicon oxide layer using a first mask, thereby forming a hard mask from the top silicon oxide layer;

etching the device layer using the hard mask, thereby forming an anchor and a microstructure in the device layer;

etching the top silicon oxide layer using a second mask, leaving the top silicon oxide layer on the microstructure;

etching the buried oxide layer using the second mask;

forming a thermal oxide layer on the wafer;

etching the thermal oxide layer using a third mask, leaving an oxide layer enclosing the microstructure;

forming a poly layer on the wafer;

planarizing poly layer;

etching a portion of the poly layer and a portion of the device layer using a fourth mask, thereby creating a handle; and etching away the oxide layer enclosing the microstructure, thereby releasing the microstructure.

9. The method of claim 8, wherein the etching the device layer includes a deep reactive ion etch (DRIE) process.

10. The method of claim 8, further comprising forming the microstructure as a microelectromechanical systems (MEMS) device.

11. The method of claim 10, further comprising forming the MEMS device as a piezoelectric resonator.

12. The method of claim 8, further comprising forming the anchor to be fully attached to the buried oxide layer on a side of the anchor.

13. The method of claim 8, further comprising bonding a metal-oxide semiconductor (MOS) wafer to the poly layer after etching away the oxide layer enclosing the microstructure.

14. The method of claim 8, further comprising encapsulating the microstructure in a hermetically sealed package and electrically coupling the microstructure to a contact on an outside of the package.

15. A microstructure device comprising:

a silicon handle layer;

a buried silicon oxide layer formed on the handle layer;

an anchor formed on the buried oxide layer, wherein the buried oxide layer extends along a full length of the anchor;

a poly silicon layer formed over the anchor;

a microstructure suspended over the handle, there being an air gap between the poly silicon layer formed over the anchor and the microstructure; and a metal-oxide semiconductor (MOS) wafer bonded to the poly layer, thereby enclosing the microstructure.

16. The microstructure device of claim 15, wherein the air gap is less than approximately 200 nm.

17. The microstructure device of claim 15, further comprising a piezoelectric layer formed on the microstructure.

18. The microstructure device of claim 15, further comprising a hermetically sealed package encapsulating the microstructure device in a hermetically sealed package.

19. The microstructure device of claim 18, further comprising a contact electrically coupling the microstructure device to an outside of the package.

20. The method of claim 1, further comprising removing the top oxide from a top surface of the anchor prior to forming the thermal oxide layer along sides of the microstructure device to enclose the microstructure device in the buried oxide layer.

* * * * *